United States Patent [19]
Burt

[11] 3,934,234
[45] Jan. 20, 1976

[54] PHOTODICHROIC READOUT DEVICE USING CIRCULARLY POLARIZED LIGHT

[75] Inventor: James Vinton Burt, Wilmington, Del.

[73] Assignee: The United States of America as represented by the Secretary of the Navy, Washington, D.C.

[22] Filed: July 5, 1974

[21] Appl. No.: 486,126

[52] U.S. Cl. ............... 340/173 CC; 340/173 LM
[51] Int. Cl.² ............... G11C 11/42; G11C 13/04
[58] Field of Search................ 340/173 CC

[56] References Cited
UNITED STATES PATENTS

| | | |
|---|---|---|
| 3,396,266 | 8/1968 | Max............................ 340/173 CC |
| 3,580,688 | 5/1971 | Schneider.................... 340/173 CC |
| 3,693,172 | 9/1972 | Feldtkeller................... 340/173 CC |

*Primary Examiner*—Terrell W. Fears
*Attorney, Agent, or Firm*—R. S. Sciascia; R. E. O'Neill

[57] ABSTRACT

A unique photodichroic readout device composed of photodichroic material thru which is passed a circularly polarized light beam that is horizontally or vertically polarized dependent upon the storage of information in the material. The beam is then passed to a beam splitter which segregates the horizontal polarized light and the vertical polarized light. The two individual beams pass to individual detectors whose output is coupled to a difference amplifier. The system also provides a method for selectively storing information within the photodichroic material.

9 Claims, 3 Drawing Figures

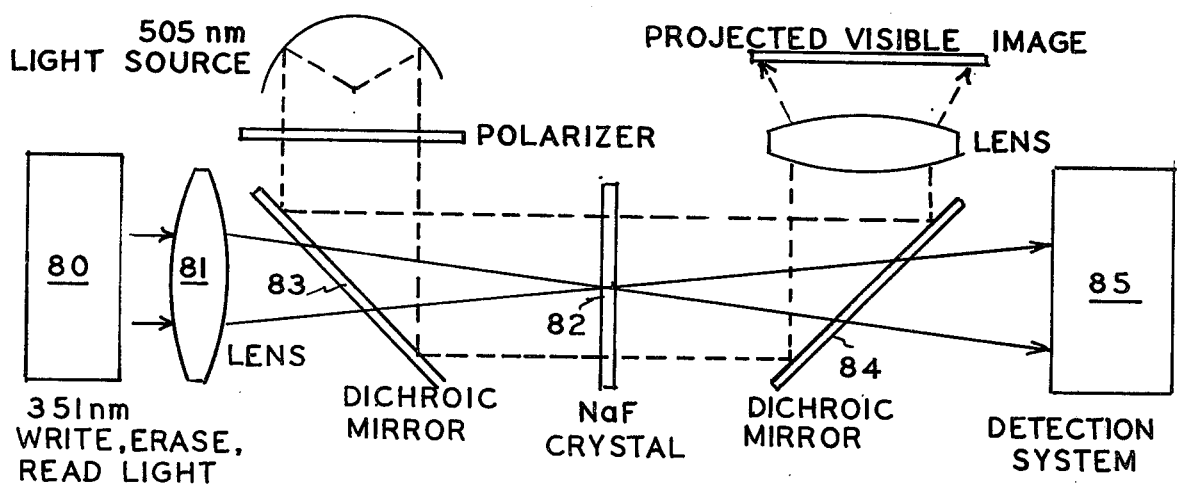
FIG. 3
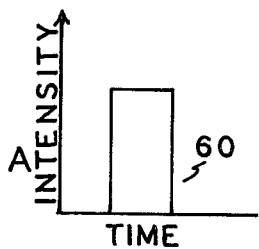
FIG. 2
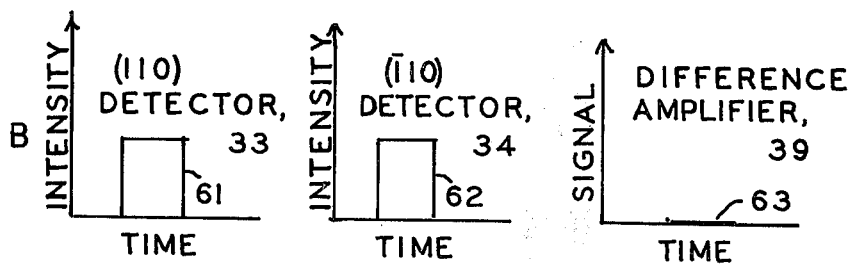
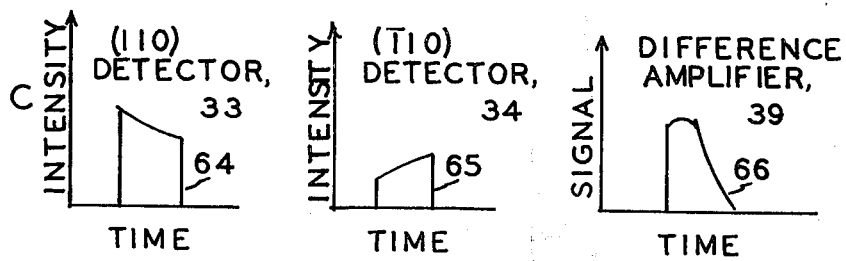
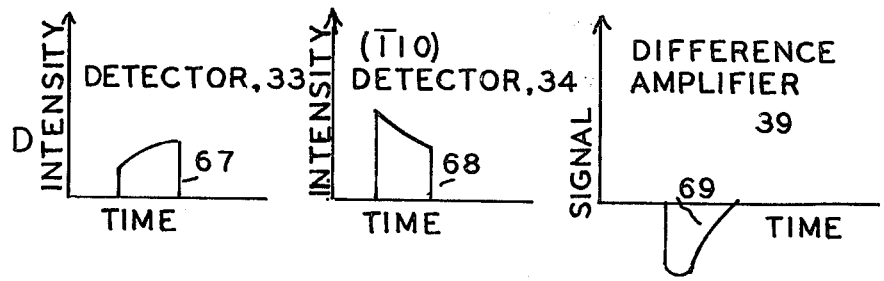

PHOTODICHROIC READOUT DEVICE USING CIRCULARLY POLARIZED LIGHT

The invention described herein may be manufactured and used by or for the Government of the United States of America for governmental puposes without the payment of any royalties thereon or therefor.

The ever increasing needs for the storage of large quantities of data in modern computer systems require new techniques in mass memories. The conventional disc or drum type magnetic memories are much too slow and the cost and effort necessary to assemble a fast, high capacity memory from solid state devices is prohibitive.

It appears that a satisfactory solution to the problem of bulk storage can be found in the use of light to make a reversible change in some physical property of a solid. Microsecond access times is possible and the storage density is limited only by the diffraction limit of the light beam, i.e., a density exceeding $10^{+7}$ bits/cm$^2$.

The idea of an optical memory is not new but previous materials suggested for implementation suffered from a variety of problems that severely limit their usefulness. Photographic film records are read only since writing produces a permanent record that can be altered only by changing the film. This involves mechanical motion which is inherently slow. Photochromics, substances which undergo color changes when illuminated with light of a given wavelength, are plagued with fatigue, destructive readout, and the necessity of using two or even three wavelengths of light.

Many of these problems can be eliminated by using a photodichroic, a material whose optical absorption depends on the polarization of the exciting light. The $M_A$ color center in KCl:NaCl is a photodichroic and it may be used as a binary indicator by proper choice of the exciting wavelength and polarization. Its versatility includes the ability to be written and erased with polarized 531 nm light and read nondestructively with 825 nm light or to be written, erased, and read (destructively) with only polarized 531 nm light. Another photodichroic, and M center in NaF, has its writing and erasing wavelengths at 350 nm and its nondestructive reading wavelength at 505 nm. Hence it can be used in a manner similar to the $M_A$ center and simultaneously as a visual display. Both the M and $M_A$ center can find application as a fast, random access memory suitable for a computer bulk memory. The M center in NaF can find the additional use as a memory-display unit suitable for incorporation with a computer based educational system.

The memory element employed is the $M_A$ color center in KCl:NaCl. Although this material is not as ideal as the M center in NaF in that it must be kept at 77°K in order to stabilize the centers, the factors that it is extremely well studied and that the exciting wavelength is in the visible are determining for the initial embodiment.

The KCl:NaCl crystal containing the $M_A$ centers is a mixed alkali halide, i.e., 1 or 2 percent of the potassium ions have been substitutionally replaced by sodium ions. Four simple excess electron centers that can exist in KCl:NaCl are the F, $F_A$, M, and $M_A$ centers. Their atomic models are all well established. The F center is an isolated negativeion vacancy that has trapped an electron. The M center consists of two F centers on nearest neighbor sites. The $F_A$ and $M_A$ centers are F and M centers associated with a substitutional sodium ion impurity as their neighbors.

It is therefore an object of this invention to provide an improved storage unit which is capable of storing digital information for rapid optical readout utilizing the concept that a photodichroic material of information stored therein has centers which will selectively pass light which is horizontally and vertically polarized and by separating light thru a beam splitter it may be determined whether the information was stored at a zero bit or a one bit.

It is a futher object of this invention to provide an improved optical memory system including means for storing information in a photodichroic material in bit form and for reading it out by passing circularly polarized light thru areas of the material that have the information stored, splitting the light beams based upon horizontal or vertical polarizaition, detecting the signals, and developing an output signal therefrom.

It is still a further object of this invention to provide an improved photodichroic readout device for detecting information stored in a photodichroic crystal memory unit comprising, a source of coherent light beam for projecting the beam along a first path, means for circularly polarizing the coherent beam in the first path and for projecting the beam in a controlled manner along a second path, a material having photodichroic properties as a storage unit in the second path of the beam, a beam splitter positioned to receive the beam of light that has passed thru the photodichroic material and splitting the beam dependent upon the beam's vertical or horizontal polarization of the beam, first and second detector means positioned to receive the horizontal or vertical beams, the detectors having electrical outputs, the electrical outputs coupled to a difference amplifier and means for taking the output of the difference amplifier and display the information that is stored in the photodichroic material.

And yet another object of this invention is to provide an improved photodichroic storage readout device comprising; a light source having a coherent output beam at a given frequency, the output light beam being propagated along a given first path, positioned along the first path in serial alignment are a shutter, a Kerr cell, a collimator and a lens for controlling and focusing the light beam and projecting the light beam along a second path the light beam being circulary polarized, a positional mirror in the second path to reflect the light beam along a third path, means for positioning the mirror, a crystal capable of storing discrete bits of information as transparent or opaque portions in the third path, the crystal composed of KCl:NaCl; the light beam projected thru the crystal, the positioning means capable of causing the light beam to pass thru different portions of the crystal and a beam splitter for splitting the beam after it passes thru the crystal depending upon the light beams vertical or horizontal polarization into fourth and fifth paths to first and second detectors, the detectors' individual outputs being coupled to a difference amplifier having an output for generating a signal.

Other objects, advantages and novel features of the invention will become apparent from the following detailed description of the invention when considered in conjunction with the accompanying drawings wherein:

FIG. 2 is a logic table for the readout device for integrating a storage bit using circularly polarized light.

FIG. 3 shows a second embodiment of the invention utilizing a sodium floride crystal.

FIG. 1 is an overall block diagram of a write-read address generator for storing information in a photodichroic material and in the embodiment shown consists of the following.

Figure 1:
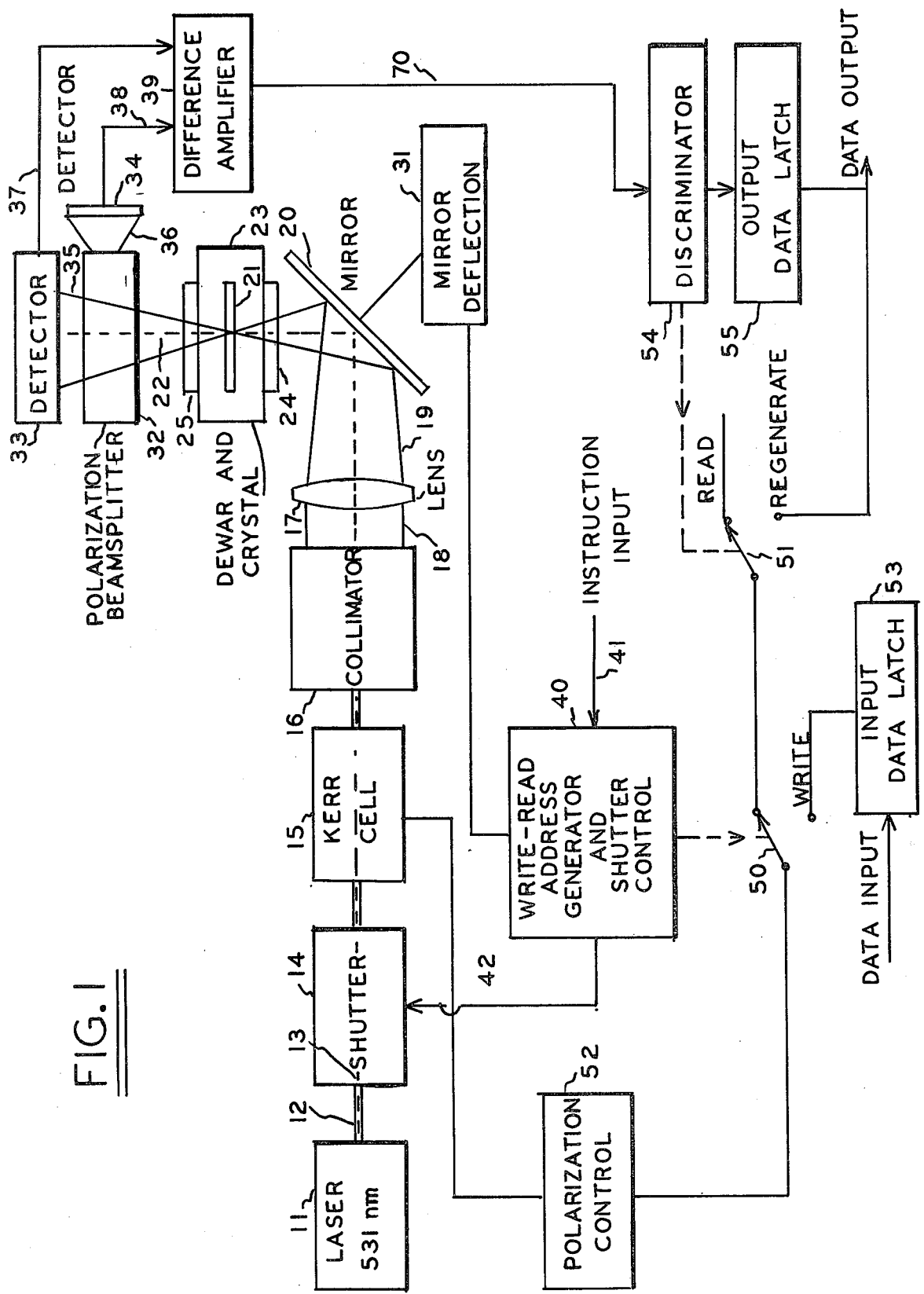
FIG. 1 is a first embodiment of the invention.

A laser 11 serves as a source of light and projects a light beam 12 along a first path 13 at the 531 nm line. A shutter 14 located along path 13 is a spinning disc having a slit and the beam is chopped into 100 microsecond pulses at a 30 Hertz repetition rate. The beam 12 from the laser is vertically polarized and has a Gaussian amplitude profile with 1.4 mm between the $l/e^2$ points. A Kerr cell 15 controls the polarized state of beam 12 and is constructed as a parallel plate capacitor immersed in nitrobenzene. The voltage applied to the capacitor resolves the (010)polarized light into a (110) "e" component and a ($\bar{1}$10)"o" component, and introduces a phase shift between the two. Depending on the voltage applied, the output beam can be either vertically, horizontally, or circularly polarized. The windows on the Kerr cell are flat $\lambda/10$ and are anti-reflection coated. A collimator 16 spatially filters the beam and expands the diameter of the amplitude to 12 mm (l.e points). This spatial filtering removes those rays not representative of a diffraction limited beam and the expansion is done to reduce the focused beam spot size. The lenses in the collimator are coated and the optics adjusted to give $\lambda/20$ performance.

A coated, fused silica lens 17 follows the collimator and focuses the expanded beam 18 to a convergent beam 19 which is deflected by a tilting mirror 20 to bring the center beam 19 to a focus within a photodichroic crystal 21. A second light path 22 is indicated by the dashed line. The photodichroic crystal is positioned within a dewar 23 that has first and second windows 24, 25 which allows for the position of the light beam. These windows are anti-reflective and flat to $\lambda/10$ over the central 70 percent of the disk. The window thicknesses were chosen so that a one atmosphere pressure differential will not deflect the center point more than $\lambda/10$ as compared to the rim.

the mirror 20 is deflected by a mirror deflection system 31 which allows the beam to be swept thru the crystal for both storing and receiving information from the crystal. A beam splitter 32 is located along light path 22 and receives the beam after it passes thru the crystal. The splitter is an inconel coated flat. First and second detectors 33, 34 receive the two beams 35, 36 after they have been split. These detectors are silicon photoconverters and when properly terminated have rise times of about 1–2 microseconds. The output of the two detectors shown as 37, 38 is coupled to a difference amplifier 39.

FIG. 1 also includes the write mode which includes a write-read address generator and shutter control 40 which receives instruction input via 41. A control line 42 is shown coupling the generator and control generator 40 to shutter 14.

A pair of switches 50 and 51 are provided to shift between the read and write modes. These switches operate to connect a polarization control 52 to the input data latch control 53 or the discriminator 54 output data latch 55.

FIG. 1 diagrams the interfacing of the optical and control systems. The whole system was designed to automatically readout and regenerate a memory of $2^N$ bits arranged linearly with constant spacing. It operates in the following manner. The memory is put into the write mode and a "1" or a "0" is assigned to each bit by (1) deflecting the mirror to give the proper spot and (2) hitting each spot with either vertically polarized light to write a "0" or horizontally polarized light to write a "1." When all bits are written, the control system is put into the read mode and the reading and regeneration of each bit proceeds automatically in sequence from bit 1 to bit $2^N$.

The detection system for readout with circularly polarized 531 nm light is drawn in FIG. 1. This method applies the fact that circularly polarized light can be considered as composed of equal intensities of (110) and ($\bar{1}$10) polarized light. Hence if a bit is written so as to pass (110) polarized light, the ($\bar{1}$10) component of a circularly polarized reading pulse will reorientate $M_A$ centers and these centers will begin to absorb (110) polarized light. Simultaneously the ($\bar{1}$10) component will become more transmitting. A steady state is finally reached when the number of centers rotated by (110) polarized light equals the number rotated by ($\bar{1}$10) polarized light. Thus if polarization filters are placed behind the crystal and orientated to pass (110) and ($\bar{1}$10) light respectively, the bit state can be determined from the polarity of the difference between the (110) and ($\bar{1}$10) transmissions. The great advantage of this detection scheme is that it operates by means of differential absorption, not absolute absorption. A thin layered photodichroic having small absorption can now be used to construct an optical memory of high bit density.

In the read mode the control system deflects the mirror to position 1 and switches a vacuum read relay to impress a voltage on the Kerr cell corresponding to circularly polarized light. The slit in the spinning disk then passes a pulse of circularly polarized light which is focused onto the bit and detected by the photodetectors. The polarity of the signal from the difference amplifier determines whether the bit was "0" or a "1" and the logic value is determined by plus and minus gates. The gates trigger multi-vibrator circuits whose outputs can be displayed on an oscilloscope to reveal the information content of the bit. Simultaneously the control system read the logic value of the signal and the bit is regenerated at the next pulse. After regeneration the mirror deflects to position 2 and the process repeats. At position $2^N$ the whole process may be stopped at command or alternately it may be looped back to position 1 and restarted.

FIG. 2 is a logic table for determining the information content of a bit by differential absorption of circularly polarized 531 nm light. A series of 10 graphs of intensity or signal depending upon the graph the vertical axis and time is the horizontal axis. The upper graph (a) shows the time intensity plot 60 of the incident circularly polarized pulse from the laser 11 as the beam has been passed from the mirror and projected into the crystal 21. The group of graphs represented as (b) shows what the output of detectors 33 and 34 would be with no KCl:NaCl crystal in place. That is, the output on line 37 in FIG. 1 would be represented by the line 61 and the output on line 38 designated as 62. Since these are equal, the output of difference amplifier 39 is zero as represented by 63. The series of graphs represented by (c), shows the output of the KCl:NaCl crystal containing $M_A$ centers in place and written to pass (110) polarized 531 nm light and to absorb ($\bar{1}$10) polarized 531 nm light.

In this case the output 64 on line 37 from detector 33 and output 65 on line 38 from detector 34 fed into difference amplifier 39 shows a positive going signal 66 which would be fed upon line 70 in FIG. 1 thru the discriminator and output data latch 55 to data output.

The series of plots (d) represent the output of the KCl:NaCl crystal containing $M_A$ centers in place and written to pass (110) polarized 531 nm light and to absorb (110) polarized 531 nm light.

In this case detector 33's output 56 is smaller than detector 34's output 68 and difference amplifier 39 provides a negative going signal 69 which in turn is processed by the discriminator and output data latch 55.

FIG. 3 shows a second embodiment of the invention using a different crystal, in this case the M center in NaF as both a memory and as a display. A coherent line source 80 provides a 351 nm write, erase, read light. This light is projected thru a lens 81 which focuses the beam to pass thru the sodium floride crystal 82 after it passes thru a dichroic mirror 83. The line then diverges and passes thru a second dichroic mirror 84 and goes on to the detection system 85.

Obviously many modifications and variations of the present invention are possible in the light of the above teachings. It is therefore to be understood that within the scope of the appended claims the invention may be practiced otherwise than as specifically described.

I claim:

1. An improved photodichroic readout device for detecting information stored in a photodichroic crystal memory unit comprising:
   a. a source of a coherent light beam for projecting said beam along a first path;
   b. means for circularly polarizing said coherent beam in said first path and for projecting said circularly polarized coherent beam in a controlled manner along a second path;
   c. a material having photodichroic properties as a storage unit in said second path of said beam;
   d. polarization beam splitter means positioned to receive said beam of light that has passed thru said photodichroic material and splitting said beam dependent upon said beam's vertical or horizontal polarization of said beam;
   e. first and second detector means positioned to receive said horizontal or vertical beams, said detectors having electrical outputs;
   f. said electrical outputs coupled to a difference amplifier; and,
   g. means for taking the output of said difference amplifier and displaying the information that is stored in said photodichroic material.

2. The improved photodichroic readout device of claim 1 wherein said source consists of a laser for generating said light beam.

3. The improved photodichroic readout device of claim 2 wherein there is provided means for modulating said light beam in a predetermined manner in said first path.

4. The improved photodichroic readout device of claim 3 wherein said modulation means consists of a shutter for dividing the light pulses into short pulse length segments.

5. The improved photodichroic readout device of claim 4 wherein there is provided a collimator and a lense in said second path to receive said modulated beam for focusing said modulated light beam to a small focal point at said photodichroic material.

6. The improved photodichroic readout device of claim 5 wherein means are provided for moving said focused beam to different points within said photodichroic material in said second path.

7. The improved photodichroic readout device of claim 6 wherein said moving means is a positional mirror for receiving said light beam after it passes thru said photodichroic material and reflecting said light beam to said beam splitter.

8. The improved photodichroic readout device of claim 7 wherein there is provided means for causing said photodichroic material to be programmed with information.

9. An improved photodichroic storage readout device comprising:
   a. a light source having a coherent output beam at a given frequency, said output light beam being circularly polarized and being propagated along a given first path;
   b. positioned along said first path in serial alignment are a shutter, a Kerr cell, a collimator and a lens for controlling and focusing said light beam and projecting said light beam along a second path;
   c. a positional mirror in said first path to reflect said light beam along a second path;
   d. means for controllably positioning said mirror;
   e. a crystal capable of storing discrete bits of information as transparent or opaque portions in said second path, said crystal composed of KCl:NaCl; said light beam projected thru said crystal, said positioning means capable of causing said light beam to pass thru different portions of said crystal; and,
   f. a beam splitter for splitting said beam after it passes thru said crystal depending upon said light beams vertical or horizontal polarization into third and fourth paths to first and second detectors, said detectors' individual outputs being coupled to a difference amplifier having an output for generating a signal.

* * * * *